(12) United States Patent
Nagao (10) Patent No.: US 7,283,837 B2
(45) Date of Patent: Oct. 16, 2007

(54) PORTABLE TERMINAL APPARATUS, RECORDING MEDIUM, AND PORTABLE TERMINAL APPARATUS CONTROL METHOD

(75) Inventor: Yasutaka Nagao, Tokyo (JP)

(73) Assignee: NEC Corporation, Tokyo (JP)

( * ) Notice: Subject to any disclaimer, the term of this patent is extended or adjusted under 35 U.S.C. 154(b) by 224 days.

(21) Appl. No.: 10/428,886

(22) Filed: May 2, 2003

(65) Prior Publication Data

US 2004/0029611 A1    Feb. 12, 2004

(30) Foreign Application Priority Data

May 9, 2002    (JP)    ............... 2002-133722

(51) Int. Cl.
*H04M 1/00*    (2006.01)
(52) U.S. Cl. ............... 455/550.1; 455/575.1; 455/575.3
(58) Field of Classification Search ............ 455/645, 455/550.1, 575.1
See application file for complete search history.

(56) References Cited

U.S. PATENT DOCUMENTS

| | | | | |
|---|---|---|---|---|
| 4,229,817 | A * | 10/1980 | Morgan et al. | 380/52 |
| 6,789,967 | B1 * | 9/2004 | Forester | 400/489 |
| 6,909,424 | B2 * | 6/2005 | Liebenow et al. | 345/169 |
| 2001/0006904 | A1 * | 7/2001 | Cha | 455/566 |
| 2001/0030663 | A1 * | 10/2001 | Nielsen et al. | 345/810 |
| 2003/0083020 | A1 * | 5/2003 | Langford | 455/90 |
| 2004/0145570 | A1 * | 7/2004 | Curelet-Balan | 345/168 |

FOREIGN PATENT DOCUMENTS

| | | |
|---|---|---|
| CN | 1317919 A | 10/2001 |
| JP | 9083402 A | 3/1997 |
| JP | 2001-16635 | 1/2001 |
| WO | WO 01/082042 | 11/2001 |

OTHER PUBLICATIONS

Abstract of Japanese Publication No. JP 2001 318756, dated Nov. 16, 2001.
Abstract of Japanese Publication No. JP 2002 108545, dated Apr. 12, 2002.
Abstract of Japanese Publication No. JP 2000 148359, dated May 26, 2000.
Abstract of German Publication No. DE 029814810U1, dated Nov. 26, 1998.

* cited by examiner

*Primary Examiner*—Lester G. Kincaid
*Assistant Examiner*—Fred Casca
(74) *Attorney, Agent, or Firm*—Scully, Scott, Murphy & Presser, PC (57) ABSTRACT

A portable terminal apparatus with an operation key includes at least one shift key, a key setting map, a key control section, and a key setting change section. The key setting map stores information about the settings of functional operations of the operation key and shift key. The key control section converts the output signals from the operation key and shift key on the basis of the key setting map. The key setting change section changes the setting of the key setting map when the shift key is pressed solely or together with the operation key. A recording medium and a method of controlling the portable terminal apparatus are also disclosed.

5 Claims, 10 Drawing Sheets

| PARAMETER | KEY STATE | MODE |
|---|---|---|
| VALUE | MOMENTARY / ALTERNATE / INVALID / OTHER | 1 ~ m |

| SHIFT KEY OPERATION \ OPERATION KEY STATE | OPERATE SHIFT KEY WITHOUT PRESSING OPERATION KEY | OPERATE SHIFT KEY WHILE KEEPING OPERATION KEY PRESSED |
|---|---|---|
| SINGLE-CLICK | DISPLAY MODE STATE | CHANGE CHARACTER CANDIDATE |
| DOUBLE-CLICK | SWITCH MODE | — |
| SUSTAIN | CONTINUOUSLY SWITCH MODE | CONTINUOUSLY CHANGE CHARACTER CANDIDATE |

| MODE \ OPERATION KEY NUMBER | K1 | K2 | K3 | ... | Kn |
|---|---|---|---|---|---|
| MODE 1 | SYMBOL | a ~ c | d ~ f | ... | ENTER |
| MODE 2 | あ,い,う,え,お | か,き,く,け,こ | さ,し,す,せ,そ | | ENTER |
| MODE 3 | 1 | 2 | 3 | | ENTER |
| ... | | | | | |
| MODE n | SYMBOL | α ~ γ | δ ~ ξ | | ENTER |

PORTABLE TERMINAL APPARATUS, RECORDING MEDIUM, AND PORTABLE TERMINAL APPARATUS CONTROL METHOD

BACKGROUND OF THE INVENTION

The present invention relates to a portable terminal apparatus and, more particularly, to the arrangement of keys of a portable terminal apparatus, a recording medium which stores a program for expanding the function of the portable terminal apparatus by the keys, and a method of controlling the portable terminal apparatus.

Recent portable terminal apparatuses represented by cellular phone sets and PDAs have been made more compact with multiple functions. Functions prepared in such a portable terminal apparatus are used, set, and selected by operating an input device such as keys provided on the apparatus main body. Along with the size reduction of the portable terminal apparatus main body, the input device must also be compact. A compact portable terminal apparatus having many functions is required to exhibit its functionality without sacrificing the user interface such as key input due to size reduction.

Figures 10A, 10B:
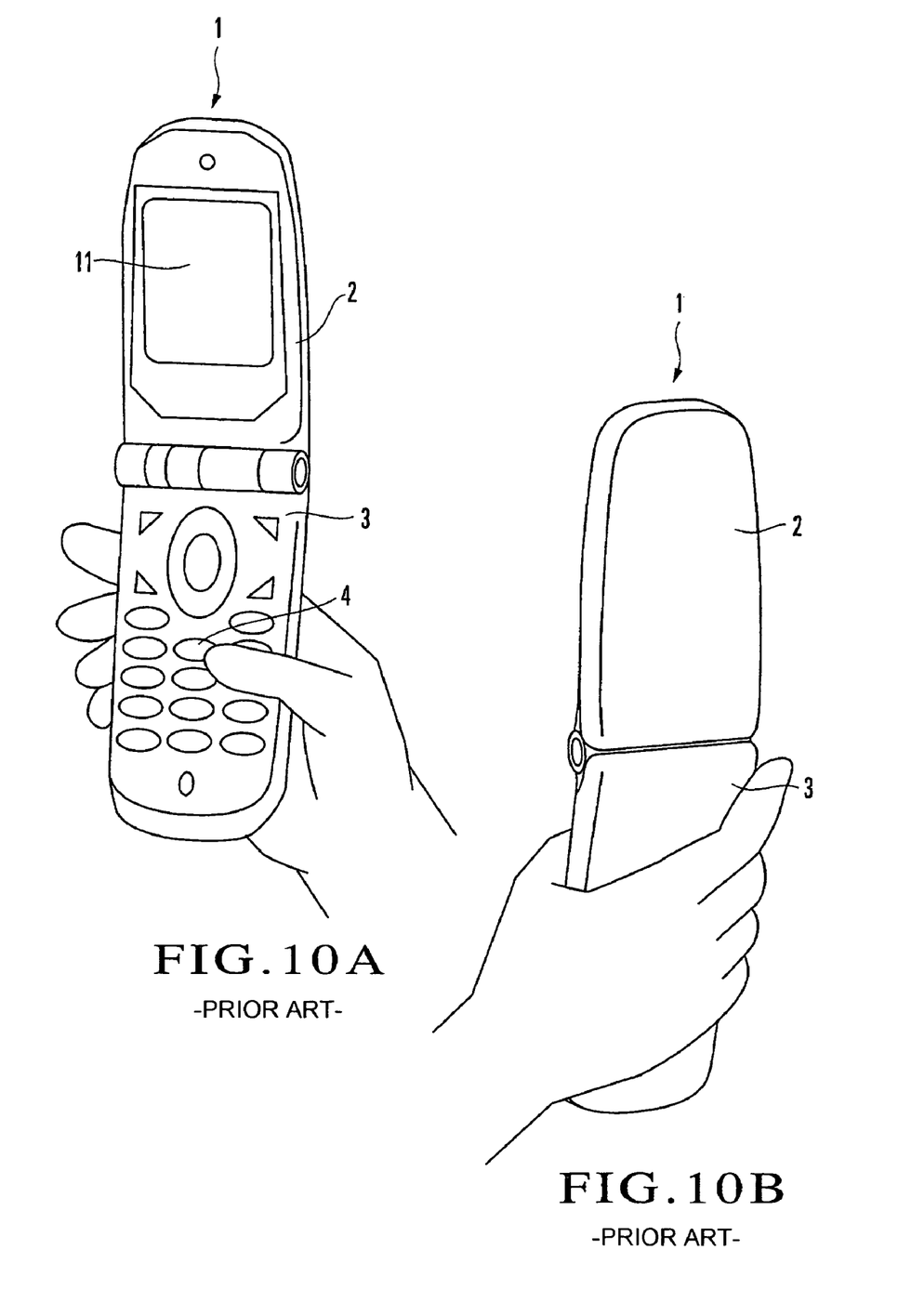
FIG. 10A is a schematic view showing the front-side outer appearance of a conventional cellular phone set.
FIG. 10B is a schematic view showing the rear-side outer appearance of the conventional cellular phone set.

FIGS. 10A and 10B show the outer appearance of a conventional cellular phone set. A folding cellular phone set 1 comprises an upper case 2 and lower case 3. A display section 11 which displays various kinds of information is formed on the front side of the upper case 2. Operation keys 4 used to input operation are formed on the front side of the lower case 3. For the upper case 2 and lower case 3, surfaces that are exposed to the outside when the cellular phone set 1 is folded are defined as rear surfaces, and surfaces that are closed inside are defined as front surfaces.

Such a cellular phone set 1 achieves sufficient size reduction and therefore normally allows a user to support it by one hand and operate the operation keys 4 only by one finger and, more particularly, the thumb of the hand.

In the conventional cellular phone set, however, if the user wants to input a desired character or change one key function, he/she must perform complex operation to press the same key a plurality of number of times or operate another key to display a menu because the number of keys is limited by size reduction of the input device. In addition, it is very inefficient to perform such operation only by one finger, and long-time operation involves user's fatigue.

SUMMARY OF THE INVENTION

It is therefore a principle object of the present invention to provide a convenient portable terminal apparatus which increases the key input efficiently without impeding size reduction of the main body, a recording medium which records a program that implements the portable terminal apparatus and a method of controlling the portable terminal apparatus.

In order to achieve the above object, according to the present invention, there is provided a portable terminal apparatus having an operation key, comprising at least one shift key, a key setting map which stores information about settings of functional operations of the operation key and the shift key, a key control section which converts output signals from the operation key and the shift key on the basis of the key setting map, and a key setting change section which changes setting of the key setting map when the shift key is pressed solely or together with the operation key.

DESCRIPTION OF THE PREFERRED EMBODIMENTS

An embodiment of the present invention will be described below in detail with reference to the accompanying drawings.

Figure 1A:
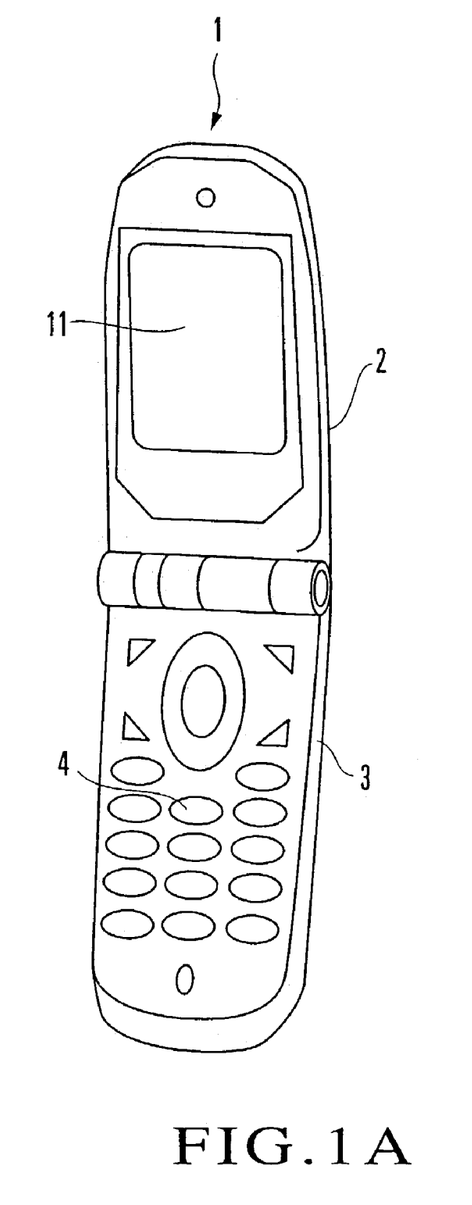
FIG. 1A is a schematic view showing the front side outer appearance of a cellular phone set according to an embodiment of the present invention.
Figure 1B:
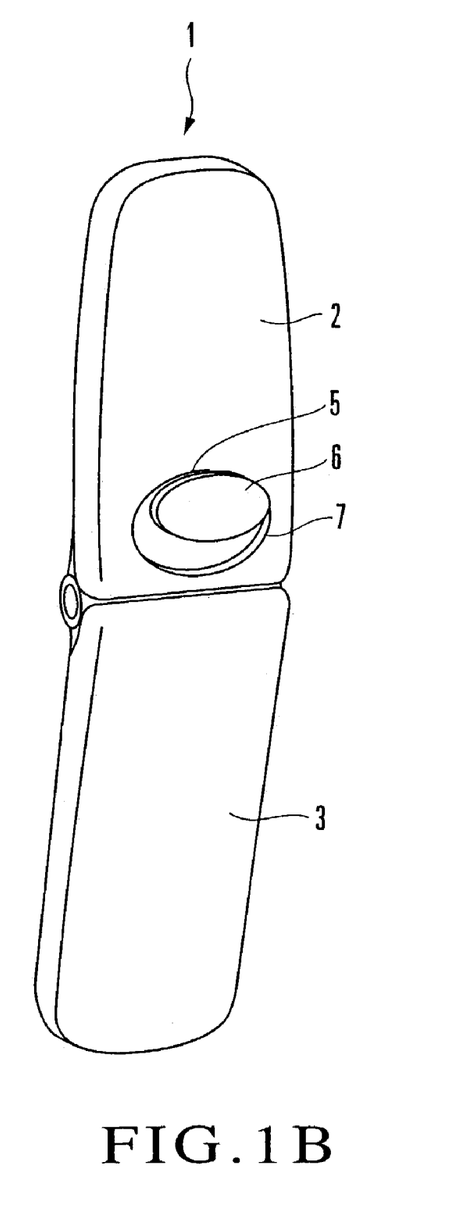
FIG. 1B is a schematic view showing the rear-side outer appearance of the cellular phone set according to the embodiment of the present invention.
Figure 2:
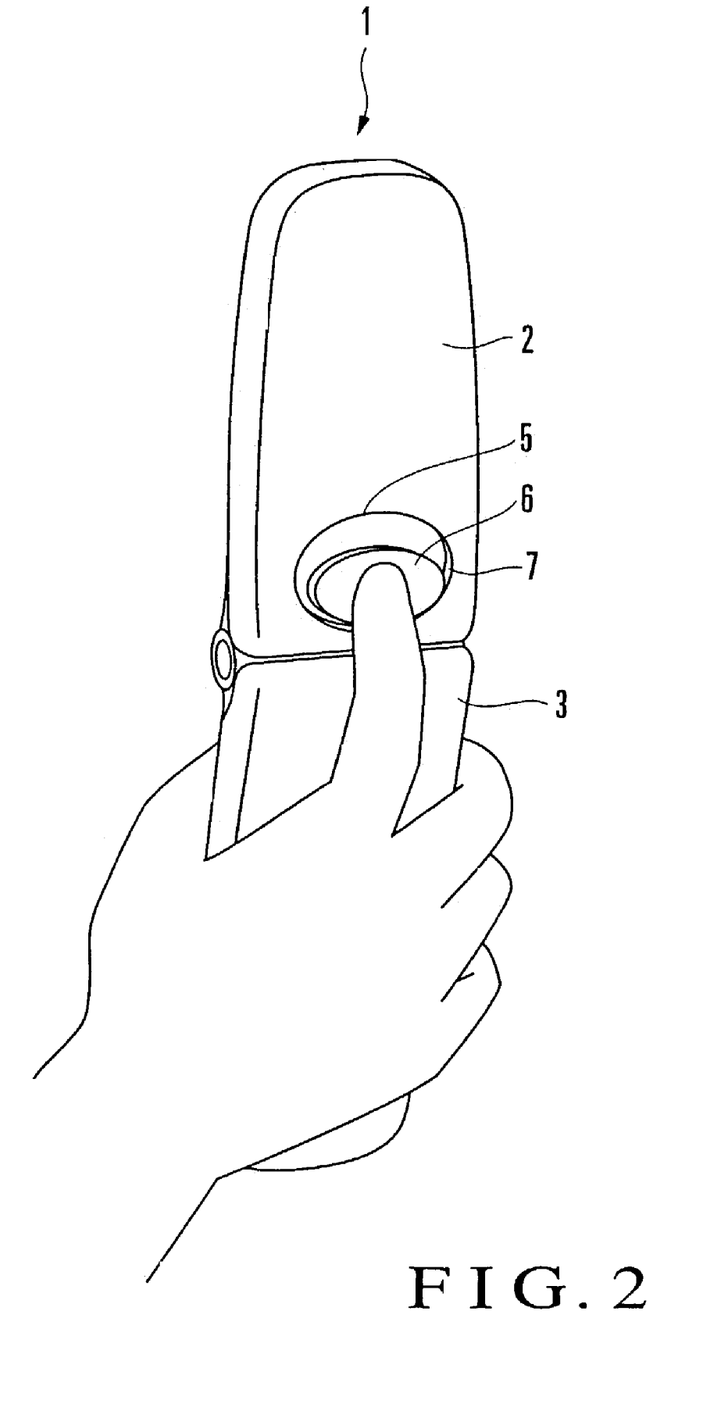
FIG. 2 is a schematic view showing a state wherein the cellular phone set according to the embodiment of the present invention is used.

The external arrangement of a cellular phone set according to this embodiment will be described with reference to FIGS. 1A, 1B, and 2. FIG. 1A shows the front-side outer appearance of the cellular phone set according to this embodiment. FIG. 1B shows the rear-side outer appearance of the cellular phone set according to this embodiment. FIG. 2 shows a state wherein the cellular phone set according to this embodiment is used. The same reference numerals as in the cellular phone set shown in FIGS. 10A and 10B denote the same constituent elements in FIGS. 1A, 1B, and 2, and a description thereof will appropriately be omitted.

A folding cellular phone set 1 comprises an upper case 2 and lower case 3. A display section 11 which displays various kinds of information is formed on the front side of the upper case 2. Operation keys 4 used to input operation are formed on the front side of the lower case 3. A shift key 5 is arranged on the rear side of the upper case 2.

The operation keys 4 are arrayed on the same plane and include a plurality of keys such as a ten-key pad and enter key, with which the user inputs characters and the like and operates the cellular phone set. Each of the operation keys 4 is assigned a specific function different from those of the remaining keys. Each of the functions of the cellular phone set 1 is implemented by pressing a corresponding key.

The shift key 5 is an auxiliary key which is pressed solely or together with the operation key 4 to expand the function of the operation key 4. The shift key 5 is formed from a sliding switch having a tub 6 and guide 7. When the tub 6 is slid along the guide 7 in the longitudinal direction of the cellular phone set 1, that the shift key 5 is pressed is detected. As shown in FIG. 2, when the user holds the cellular phone set 1 by one hand so that the operation keys 4 are operated especially by the thumb and the shift key 5 especially by the index finger, he/she can operate the operation keys 4 and shift key 5 simultaneously by one hand. The switching of the shift key 5 is made very light so as to reduce the load on the user's hand even when the shift key 5 and operation key 4 are simultaneously pressed.

The tub 6 is preferably larger than each of the operation keys 4. Accordingly, the user who holds the cellular phone set 1 by one hand can operate the shift key 5 either by the left hand or by the right hand.

As described above, the cellular phone set 1 according to this embodiment has the shift key 5 on the rear side. Since the number of operation keys 4 arranged on the front side can be decreased, size reduction can be implemented.

Figure 3:
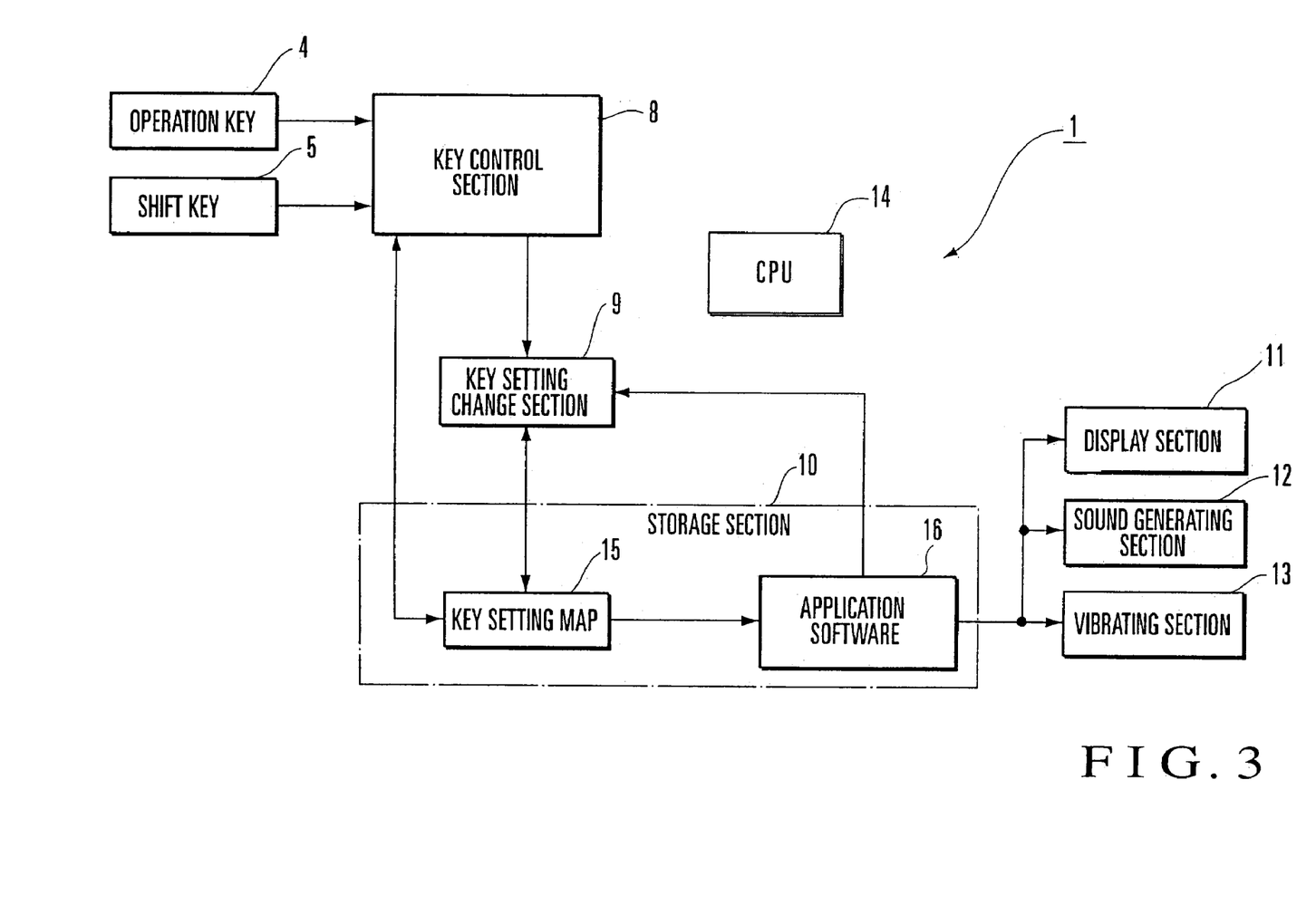
FIG. 3 is a functional block diagram of the cellular phone set according to the embodiment of the present invention.

Next, the internal arrangement of the cellular phone set according to this embodiment will be described with reference to FIG. 3. FIG. 3 shows the cellular phone set according to this embodiment.

The cellular phone set 1 comprises the operation key 4, the shift key 5, a key control section 8, a key setting change section 9, a storage section 10 which stores a key setting map 15 and application software 16, the display section 11, a sound generating section 12, a vibrating section 13, and a CPU 14. These constituent elements are connected through a bus (not shown).

Figure 4:
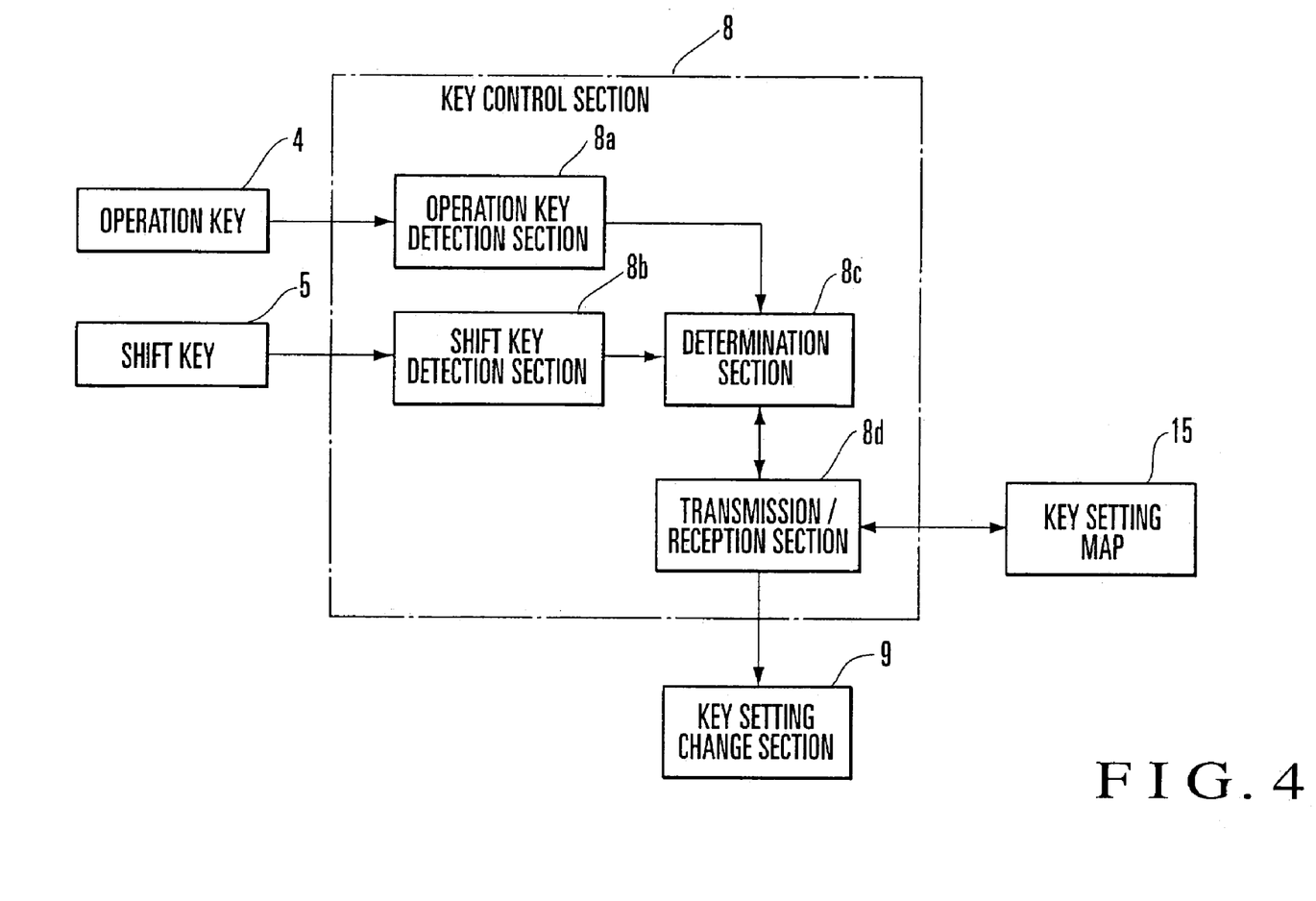
FIG. 4 is a functional block diagram showing the arrangement of a key control section 8 shown in FIG. 3.

The key control section 8 manages the way of operating the operation key 4 or shift key 5. The key control section 8 converts information input from the operation key 4 or shift key 5 into the function assigned to the key by referring to the key setting map 15 stored in the storage section 10 and inputs the information to the application software 16. The arrangement of the key control section 8 will be described in more detail with reference to FIG. 4. FIG. 4 shows the more detailed arrangement of the key control section 8.

The key control section 8 is constituted by an operation key detection section 8a, shift key detection section 8b, determination section 8c, and transmission/reception section 8d.

The operation key detection section 8a detects information input from the operation key 4 and sends the information to the determination section 8c.

The shift key detection section 8b detects information input from the shift key 5 and sends the information to the determination section 8c.

On the basis of the information input from the operation key 4 or the information input from the shift key 5, the determination section 8c determines the press timing of the operation key 4 or shift key 5 and the pressed state (single-click, double-click, sustain, or the like) of the operation key 4 or shift key 5. In addition, on the basis of the determination result and the key setting map 15, the determination section 8c converts the information input from the operation key 4 or the information input from the shift key 5 into the function assigned to the key and sends the information to the transmission/reception section 8d.

The transmission/reception section 8d sends the information received from the determination section 8c to the application software 16 through the key setting change section 9 or key setting map 15. The transmission/reception section 8d also receives information about the key setting map 15 and sends the information to the determination section 8c. Note that the transmission/reception section 8d may directly send information received from the determination section 8c to the application software 16.

The key setting change section 9 changes operation settings, operation definitions, key assignments in each input mode, and the like of the operation keys 4 and shift key 5, which are registered in the key setting map 15. The settings can be changed by the user using the operation keys 4 and shift key 5 or by the application software 16 in its function.

The key control section 8 and key setting change section 9 are implemented by the cooperation of hardware and software resources.

The storage section 10 comprises a storage means such as a memory or a hard disk. The storage section 10 stores programs such as the key setting map 15 and application software 16 and stores the programs.

The key setting map 15 is a program in which pieces of information related to the settings of the operation keys 4 and shift key 5 are stored. The key setting map 15 defines the settings of operations, functions corresponding to the operations, key assignments, and the like of the operation keys 4 and shift key 5. The key setting map 15 includes, e.g., a shift key state map 151, shift key operation definition map 152, and operation key operation definition map 153 to be described later.

The application software 16 is a program that implements the operation and function of the cellular phone set 1. The application software 16 executes the program of its own in accordance with an instruction based on the operation key 4 or shift key 5 and issues an instruction to the display section 11, sound generating section 12, or vibrating section 13 as needed.

The display section 11 is constituted by a known display means such as a liquid crystal display. The display section 11 displays various kinds of information on the screen on the basis of an instruction from the application software 16.

The sound generating section 12 is constituted by a known sound generating means such as a speaker or buzzer. The sound generating section 12 generates sound on the basis of an instruction from the application software 16.

The vibrating section 13 is constituted by a known vibrating means such as a vibrator. The vibrating section 13 vibrates on the basis of an instruction from the application software 16.

The CPU 14 functions as a processor which integrates the above-described constituent elements in the cellular phone set 1. More specifically, the CPU 14 executes the functions of the key control section 8, key setting change section 9, display section 11, sound generating section 12, and vibrating section 13 on the basis of the key setting map 15 and application software 16.

Figures 5A, 5B:
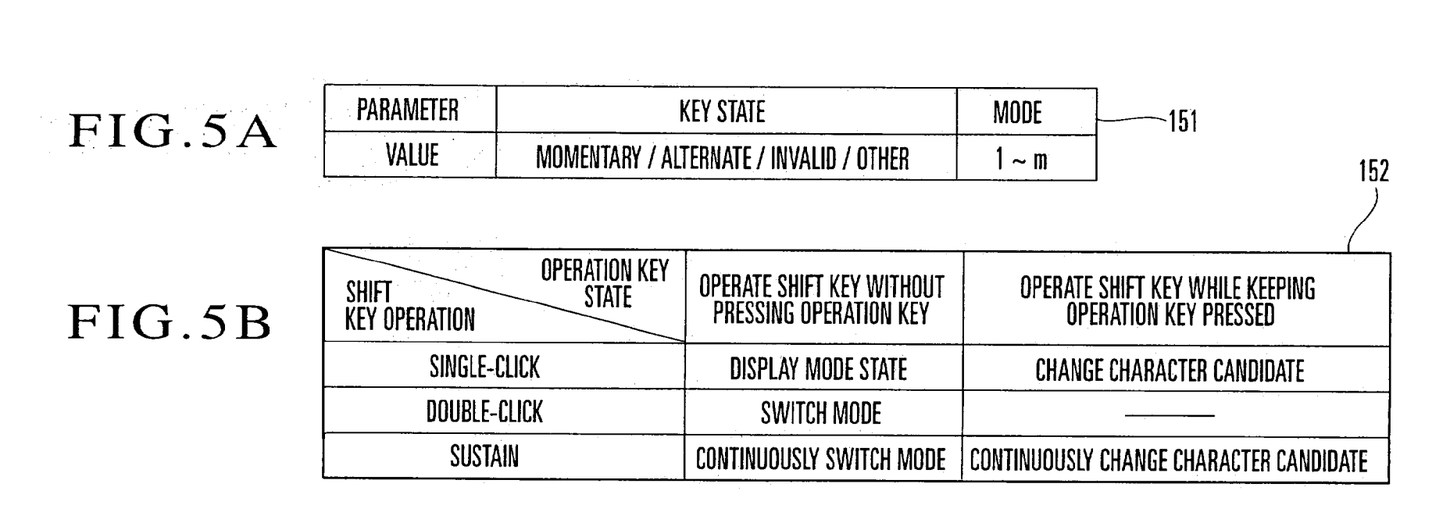
FIG. 5A is a view showing an example of operation setting on a shift key state map 151 according to the embodiment of the present invention.
FIG. 5B is a view showing an example of operation setting on a shift key operation definition map 152.
Figure 5C:
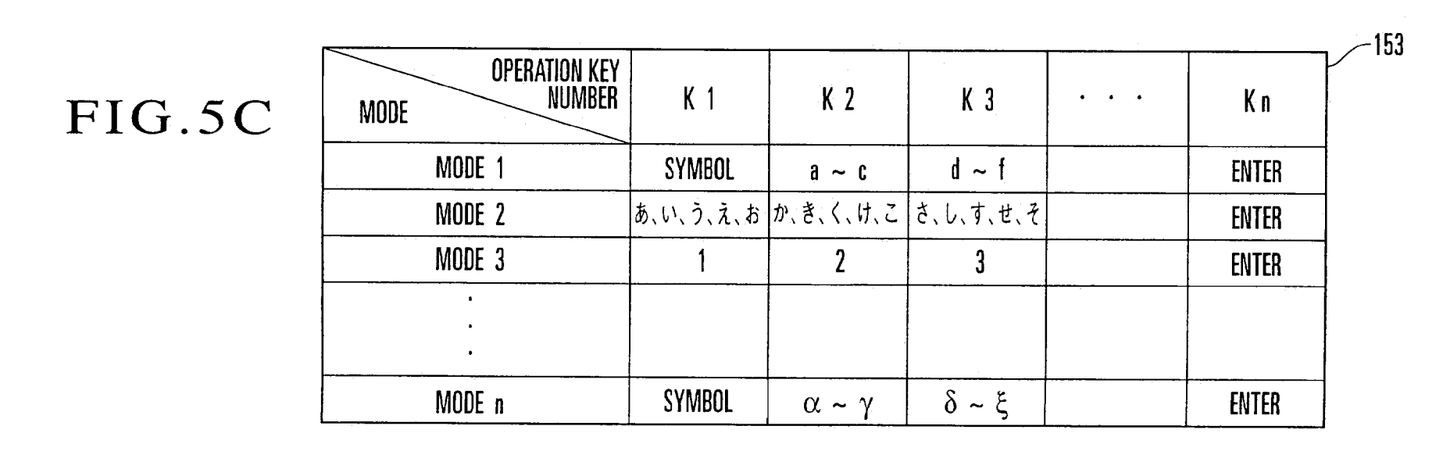
FIG. 5C is a view showing an example of operation setting on a operation key operation definition map 153.

The operation of the cellular phone set having the shift key 5 will be described next with reference to FIGS. 5A, 5B, and 5C. FIGS. 5A, 5B, and 5C show the concept of the key setting map 15 shown in FIG. 3. FIG. 5A shows an example of operation setting on the shift key state map 151. FIG. 5B shows an example of operation setting on the shift key operation definition map 152. FIG. 5C shows an example of operation setting on the operation key operation definition map 153.

Examples of the way of pressing the shift key 5 are ① press (single-click) the shift key 5 while keeping the operation key 4 pressed, ② press (sustain) the shift key 5 while keeping the operation key 4 pressed, ③ press (single-click) only the shift key 5, and ④ press (sustain) only the shift key 5. The operation of the cellular phone set depending on the difference in pressing way is determined by the key setting map 15.

Assume that the operation setting of the shift key 5 is "momentary". In this case, only when the user is pressing the shift key 5, the application software 16 recognizes the state (shift mode) wherein the shift key 5 is being pressed. Hence, when the user presses the shift key 5 and operation key 4 together, the function of the operation key 4 is expanded.

Assume that the operation setting of the shift key 5 is "alternate". In this case, when the user presses the shift key 5 again, the mode changes to the shift mode. When the user presses the shift key 5 once again, the shift mode is canceled. In this mode, once the user presses the shift key 5, the function of the operation key 4 can be expanded by pressing only the operation key 4.

As another kind of operation setting of the shift key 5, an "invalid" mode in which the pressed state of the shift key 5 is not recognized to prevent any operation error by erroneous operation, or a setting mode ("other" in FIG. 5A) in which the mode changes to the shift mode by another operation can be prepared.

A plurality of kinds of (1 to m) operation settings can be set for the shift key 5. The above-described operation setting can be changed by operating the operation key 4 or shift key 5 under a certain condition (e.g., at the time of activation of the shift key operation setting application).

As shown in FIG. 5B, the shift key operation definition map 152 defines the functions assigned in correspondence with the operations of the shift key 5. The shift key operation definition map 152 shown in FIG. 5B presumes that the shift key 5 is set in the "momentary" mode. In the "momentary" mode, function expansion of the operation key 4 is implemented by pressing the shift key 5 and operation key 4 together. A function can also be assigned even when only the shift key 5 is operated. In this example, different implemented functions are assigned to a case wherein only the shift key 5 is operated and a case wherein the shift key 5 and operation key are operated together.

Figure 6:
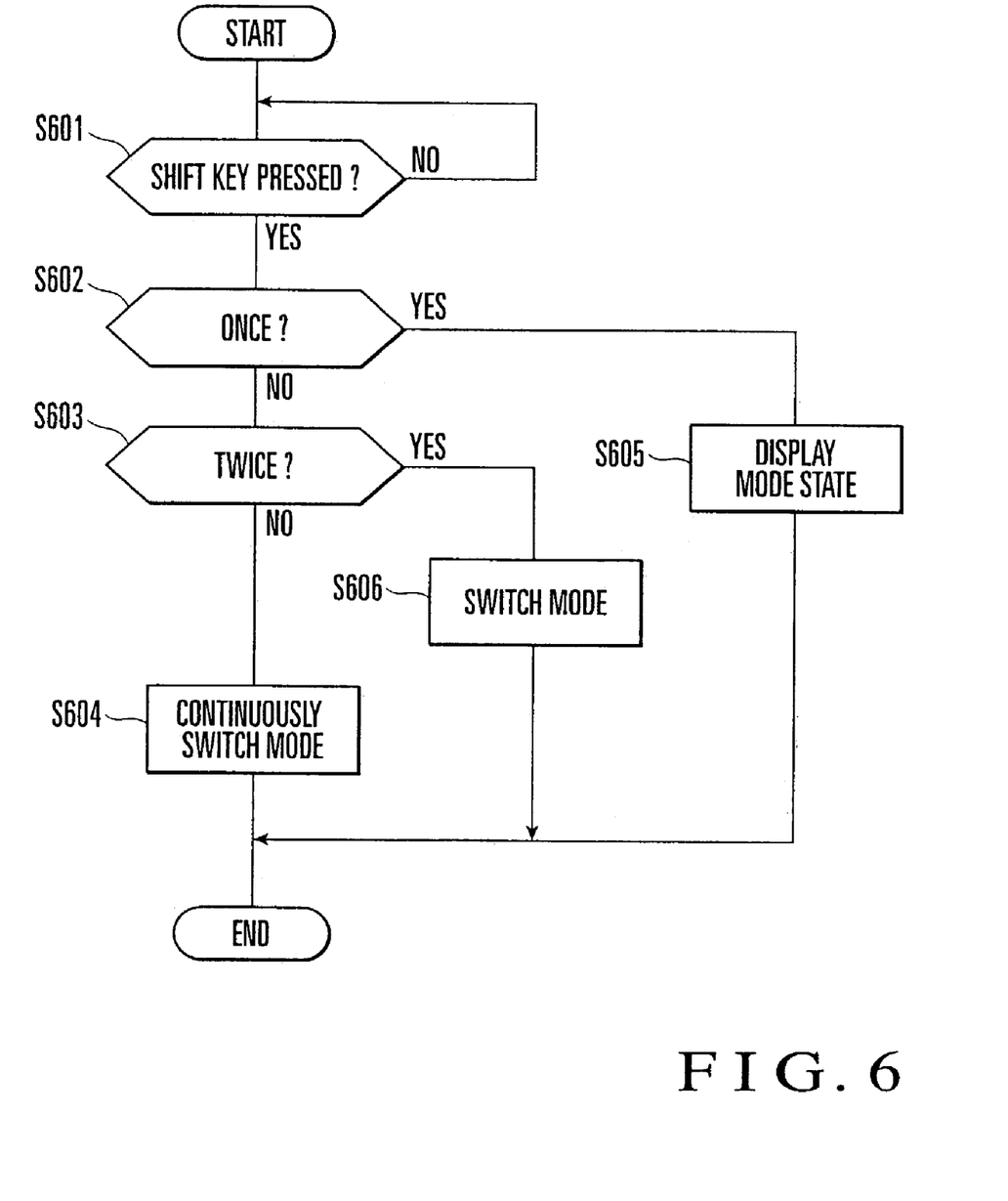
FIG. 6 is a flow chart showing the operation of a portable terminal apparatus 1 when a shift key 5 is set in a "momentary" mode, and only the shift key 5 is operated.

A case wherein only the shift key 5 is operated will be described with reference to FIGS. 5B and 6. FIG. 6 shows the operation of the portable terminal apparatus 1 when the shift key 5 is set in the "momentary" mode, and only the shift key 5 is operated. A case wherein the shift key operation definition map 152 has such a definition that when only the shift key 5 is operated, the form (input mode) of the function assigned to each of the operation keys 4 is changed will be described. When the key control section 8 detects that the shift key 5 is pressed once (YES in step S601 and YES in step S602), the application software 16 issues an instruction to, e.g., the display section 11 to display the currently set input mode (step S605). When the key control section 8 detects that the shift key 5 is continuously pressed twice (YES in step S601, NO in step S602, and YES in step S603), the application software 16 switches the input mode (step S606). When the key control section 8 detects that the shift key 5 is pressed three times or more or kept pressed for a predetermined time or more (YES in step S601, NO in step S602, and NO in step S603), the application software 16 continuously switches the input mode (step S604). Even when the shift key 5 is continuously pressed twice or kept pressed for a predetermined time or more, the application software 16 may issue an instruction to the display section 11 to display a message representing that the input mode is switched.

Figure 7:
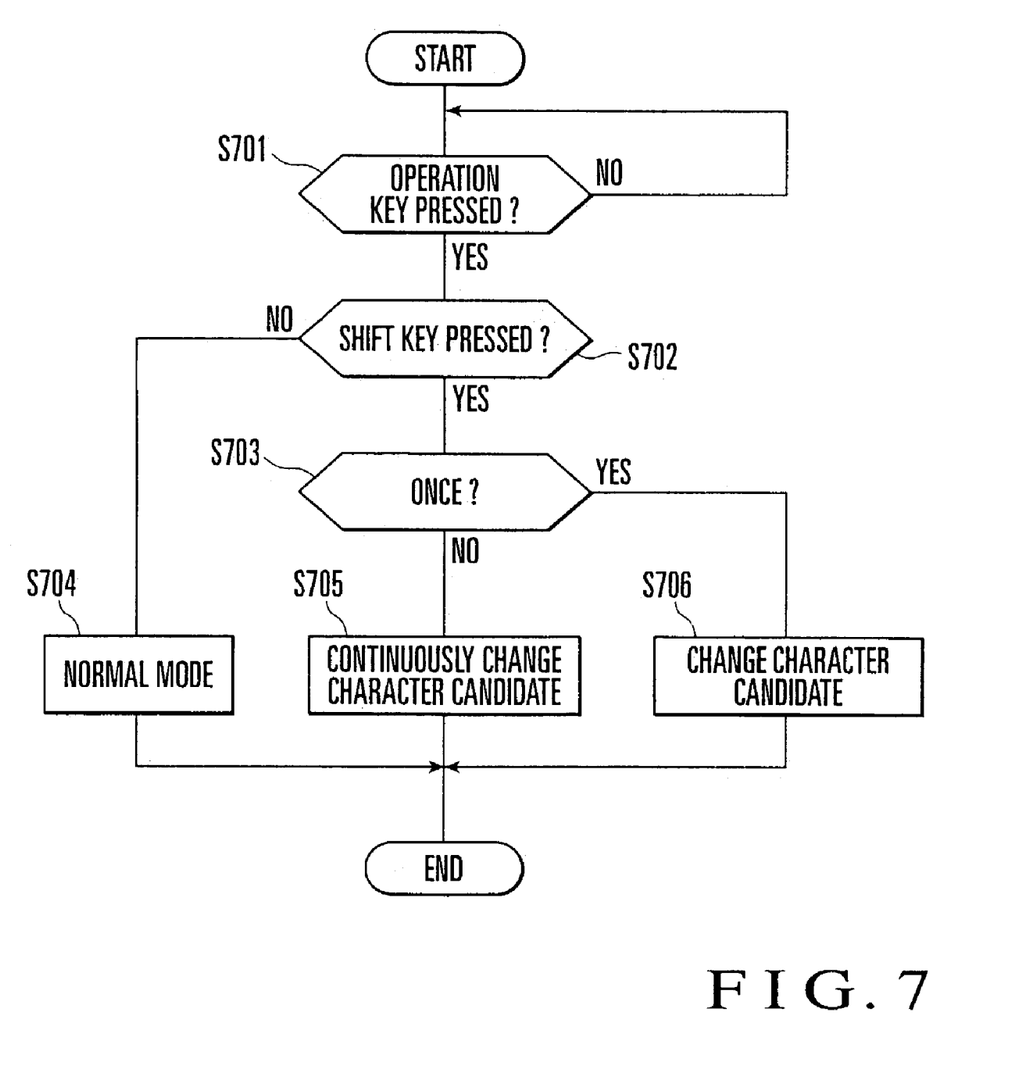
FIG. 7 is a flow chart showing the operation of the portable terminal apparatus 1 when the shift key 5 is operated while an operation key 4 is kept pressed.

A case wherein the shift key 5 is operated while the operation key 4 is kept pressed will be described next with reference to FIGS. 5B and 7. FIG. 7 shows the operation of the portable terminal apparatus 1 when the shift key 5 is operated while the operation key 4 is kept pressed. A case will be described wherein the shift key operation definition map 152 has such a definition that when the shift key 5 is operated while the operation key 4 is kept pressed, the candidate of characters to be input in character input is changed. While the operation key 4 is kept pressed (YES in step S701), when the key control section 8 detects that the shift key 5 is pressed once (YES in step S702 and YES in step S703), the application software 16 changes the candidate of characters to be input to the next candidate (step S706). While the operation key 4 is kept pressed (YES in step S702), when the key control section 8 detects that the shift key 5 is pressed twice or more or kept pressed for a predetermined time or more (NO in step S703), the application software 16 continuously changes the candidate of characters to be input (step S705). While the operation key 4 is kept pressed (YES in step S701), when the key control section 8 detects that the shift key 5 is not pressed (NO in step S702), the application software 16 operates in the normal mode without changing the candidate of characters to be input (step S704).

Even when the shift key 5 is set in a mode other than the "momentary" mode, an operation definition map corresponding to the operation of the shift key 5 is generated. The items of corresponding operation key states can be individually defined in accordance with the mode of the shift key.

In addition to the above-described arrangement, the shift key operation definition map 152 can appropriately freely set functions assigned in correspondence with the operation of the shift key 5 in implementing various functions implemented by a cellular phone set such as application software such as a shooting game or a browser application. For example, in a shooting game, the shift key 5 may be assigned to a shoot key and operated by the index finger of the user. In a browser application, the shift key 5 may the assigned to a scroll key in combination with the operation key 4.

As shown in FIG. 5C, the operation key operation definition map 153 defines functions assigned to the respective operation keys 4 for each input mode set in FIG. 5B or by another means. For example, alphabets are assigned to the respective operation keys 4 in input mode 1, hiragana characters are assigned in input mode 2, numbers are assigned in input mode 3, and Greek characters are assigned in input mode n. In this way, the functions assigned to the respective operation keys 4 are changed for each input mode. For the convenience, a key (Kn) representing, e.g., "enter" can be defined such that the assigned function is not changed even when the input mode is changed.

Since the cellular phone set 1 of this embodiment has the above-described arrangement, the key input efficiency increases. In the conventional cellular phone set, when a sentence containing hiragana characters, katakana characters, alphabets, numbers, pictorial symbols, and the like is to be input for, e.g., mail, the input mode must be switched using menus or operation keys. However, according to the cellular phone set 1 of this embodiment, the input mode can be switched only by operating the shift key 5. Hence, the number of operations decreases.

In addition, in the conventional cellular phone set, for example, when hiragana characters, katakana characters, alphabets, or the like are to be input, a desired character must be selected by pressing the same key many times. However, according to the cellular phone set 1 of this embodiment, the key setting map 15 can be set such that the same operation as in the prior art can be executed by repeatedly pressing the shift key 5 while keeping the corresponding operation key 4 pressed. With such setting, since not the thumb that operates the operation key 4 but the index finger that operates the shift key 5 is used many times, characters can easily be input with the cellular phone set 1 of this embodiment as compared to the conventional cellular phone set.

Furthermore, in the conventional cellular phone set 1, when input characters are to be converted into characters in another form, and for example, when hiragana characters are to be converted into kanji characters, the thumb must be moved across a wide range over the operation keys 4 to press the operation keys 4 many times. For this reason, the user particularly feels fatigued at his/her thumb when operating the conventional cellular phone. However, according to the cellular phone set 1 of this embodiment, for example, when the character input function can be assigned to the operation keys 4, and the conversion function is assigned to the shift key 5, character input and conversion can be performed using different fingers. Hence, the operability increases, the fatigue by one-finger operation is reduced, and input and conversion can quickly be performed.

The shift key state map 151, shift key operation definition map 152, and operation key operation definition map 153 that construct the key setting map 15 are not limited to the above-described arrangements and can appropriately freely be changed. Hence, the cellular phone set according to this embodiment can implement any function.

In this embodiment, the shift key 5 is arranged on the rear side of the upper case 2. If the shift key 5 can be arranged at a position where the shift key 5 can smoothly be operated by the index finger, second finger, third finger, or little finger while operating the operation keys 4 with the thumb, the position of the shift key 5 can freely be changed to, e.g., the rear surface of the lower case 3, i.e., the rear or side surface of the cellular phone set 1.

Figure 8:
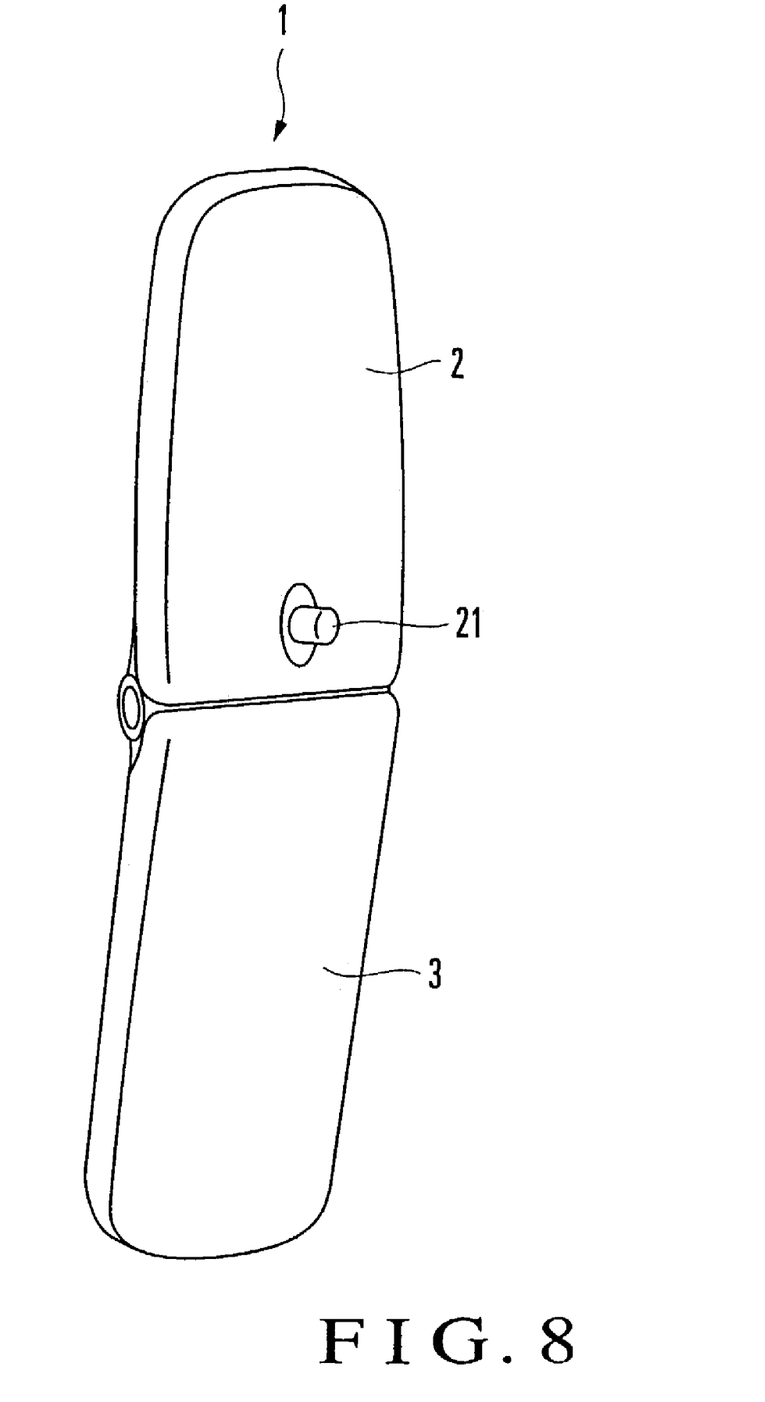
FIG. 8 is a schematic view showing the rear-side outer appearance of a cellular phone set according to another embodiment of the present invention.

A modification to the embodiment will be described next with reference to FIG. 8. FIG. 8 shows the rear-side outer appearance of a cellular phone set according to another embodiment of the present invention. In a cellular phone set 1 shown in FIG. 8, the shift key 5 of the cellular phone set 1 shown in FIG. 1 is changed to a shift key 21. The shift key 21 is constituted by a pointing device such as a joystick. When the end portion projecting from the rear surface of an upper case 2 is tilted, that the shift key 21 is pressed is authenticated. The cellular phone set 1 according to this embodiment can implement the same function and effect as those of the shift key 5 shown in FIG. 5 even by arranging the above-described shift key 21 constituted by a pointing device.

In the cellular phone set 1 shown in FIG. 1, the shift key 5 constituted by a sliding switch may be changed to a shift key formed from a touch panel or jog shuttle. Even with this arrangement, the cellular phone set 1 according to this embodiment can implement the same function and effect as those of the shift key 5.

The shift key 21 shown in FIG. 8 can tilt its end portion in multiple directions. Hence, more functions can be assigned as compared to the shift key 5 formed from a sliding switch. Accordingly, the cellular phone set 1 shown in FIG. 8 can implement many functions.

In addition, when a shift key constituted by a touch panel is arranged on the cellular phone set 1, the shift key is arranged the rear side of the cellular phone set 1. Since the area of the touch panel can be made larger than that arranged on the front surface, the operability of the cellular phone set according to this embodiment can be increased.

Figure 9:
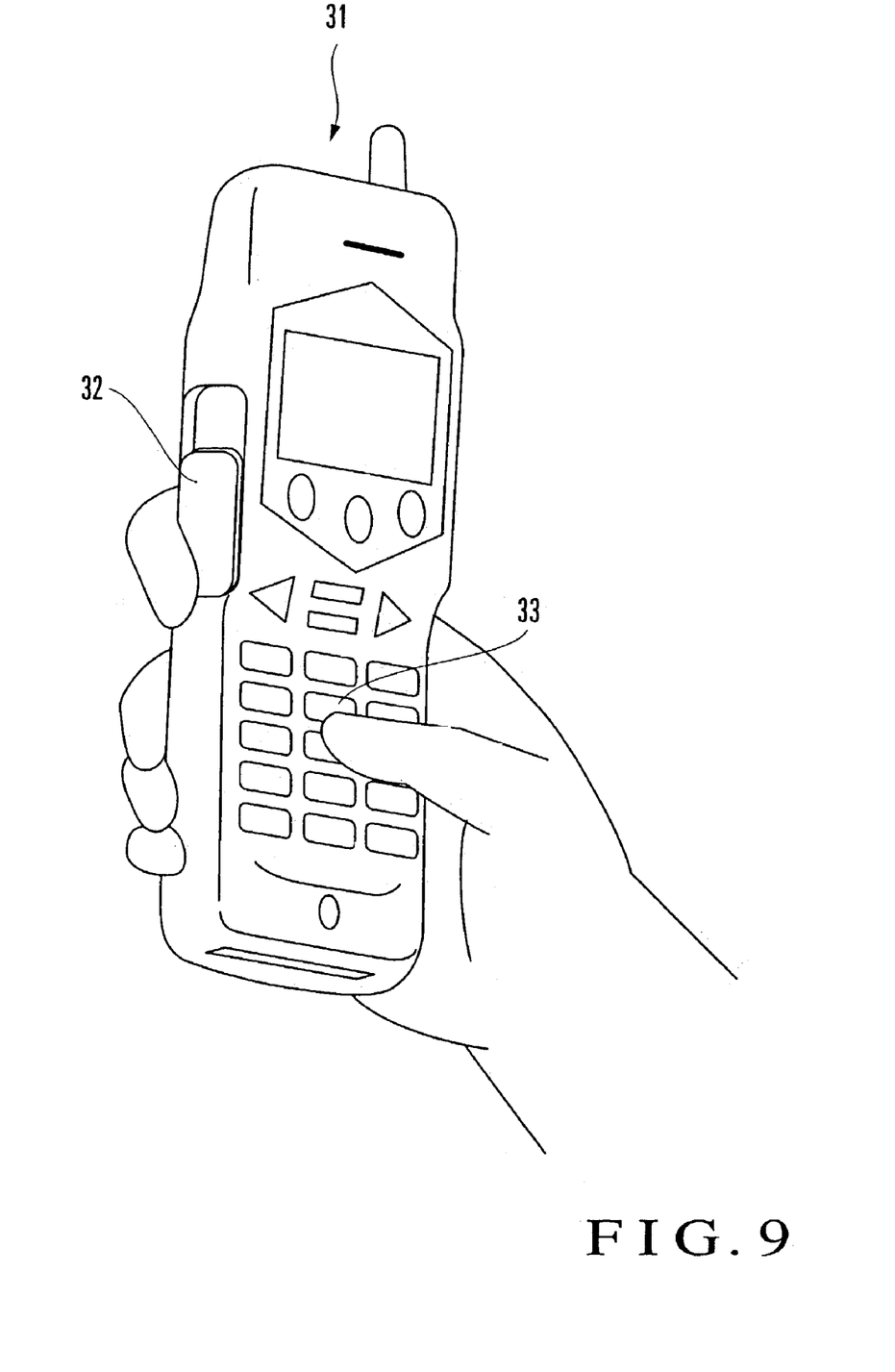
FIG. 9 is a schematic view showing the outer appearance of a cellular phone set according to still another embodiment of the present invention.

In this embodiment, the shift key is arranged on the folding cellular phone set. The shape of the cellular phone set is not limited to a folding type and can appropriately freely be changed to, e.g., an integrated cellular phone set 31 as shown in FIG. 9.

In this embodiment, the shift key is arranged on the rear side of the cellular phone set. However, the position of the shift key is not limited to the rear side. For example, as shown in FIG. 9, a shift key 32 may be arranged on the side surface of the cellular phone set 31. The position of the shift key can appropriately freely be set to any position except the front side of the cellular phone set, where operation keys 33 are arranged.

In this embodiment, a plurality of shift keys can be arranged on a cellular phone set. With this arrangement, the cellular phone set of this embodiment can implement various functions.

In this embodiment, the cellular phone set has been exemplified as a portable terminal apparatus. However, the present invention can also be applied to various portable terminal apparatuses such as a PDA.

As has been described above, a shift key which can be operated by a finger of the hand that holds the portable terminal apparatus of the present invention, which is different to the finger that operates operation keys, is arranged. With this arrangement, since a shift key which can be operated by a finger of the hand that holds the portable terminal apparatus of the present invention, which is different to the finger that operates operation keys, is arranged, the shift key can be operated by a finger of the hand that holds the portable terminal apparatus, which is different to the finger that operates the operation keys. For this reason, the key input efficiently of the portable terminal apparatus increases, and as a consequence, the convenience increases.

According to the present invention, the shift key is arranged on a surface having no operation keys of the portable terminal apparatus. Since size reduction of the portable terminal apparatus main body is not impeded, the portability and operability increase, resulting in high convenience.

In addition, in the recording medium and portable terminal apparatus control method according to the present invention, since the operation setting of the shift key can be changed in accordance with the function to be implemented by the portable terminal apparatus, the convenience increases.

Furthermore, when the settings of the functional operations of the operation keys and shift key are changed, the function to be implemented by the portable terminal apparatus can be expanded.

What is claimed is:

1. A cellular telephone set comprising:
   an operation key provided on a front side of the telephone set;
   a shift key provided on a rear side of the telephone set;
   a key setting map which stores information about settings of functional operations of the operation key and the shift key;
   a key control section which converts output signals from the operation key and the shift key on the basis of said key setting map; and
   a key setting change section which changes setting of said key setting map when said shift key is pressed solely or together with the operation key, wherein the operation key and the shift key are arranged to be operable by one hand of an operator with the thumb and one of the remaining fingers respectively both independently of one another and simultaneously, and when the cellular telephone set is supported by the one hand of the operator, that operator may operate the operation key of the cellular telephone set to conduct telephone communication.

2. A cellular telephone set according to claim 1, wherein while a user holds a main body of said cellular telephone set the operation key and said shift key can be operated by different fingers of a hand that holds the main body.

3. A cellular telephone set according to claim 1, wherein said shift key comprises a sliding switch.

4. A cellular telephone set according to claim 1, wherein said shift key comprises a pointing device.

5. A cellular telephone set according to claim 1, wherein said shift key comprises a touch panel.

* * * * *